United States Patent [19]

Trout

[11] 4,160,175
[45] Jul. 3, 1979

[54] DIFFERENTIAL THRESHOLD DETECTOR
[75] Inventor: Philip A. Trout, Silver Spring, Md.
[73] Assignee: The United States of America as represented by the Secretary of the Navy, Washington, D.C.
[21] Appl. No.: 868,970
[22] Filed: Jan. 12, 1978
[51] Int. Cl.² .......................................... H03K 5/153
[52] U.S. Cl. ................................. 307/358; 307/351; 328/151; 328/147; 328/135
[58] Field of Search ................. 307/358, 351; 328/151, 328/146, 147, 135

[56] References Cited
U.S. PATENT DOCUMENTS

| | | | |
|---|---|---|---|
| 3,654,444 | 4/1972 | Gurol | 328/151 X |
| 3,714,464 | 1/1973 | Nutt | 328/151 X |
| 3,797,894 | 3/1974 | Carp | 307/358 X |
| 3,804,979 | 4/1974 | Knowles | 307/358 X |

OTHER PUBLICATIONS

D. E. Fiehmann et al., "Data Demodulator Circuit Arrangement" IBM Technical Disclosure Bulletin, vol. 20, No. 2, July, 1977, p. 769.

Primary Examiner—John Zazworsky
Attorney, Agent, or Firm—R. S. Sciascia; A. L. Branning; G. J. Perry

[57] ABSTRACT

An adaptive reference threshold detector for sensing a drop of predetermined magnitude in the level of an input signal from its peak value during an interval of time. A capacitor, diode coupled to the output of a voltage follower, is charged to a level coincident with the maximum input signal voltage during the time interval of interest. The voltage stored thereon is coupled through a negative feedback arrangement and resistive divider network to one port of a voltage comparator. The input signal itself serves as the second input to this voltage comparator circuit. A logic level signal is generated by this comparator when the difference between its two input port signals exceeds a predetermined value.

2 Claims, 2 Drawing Figures

DIFFERENTIAL THRESHOLD DETECTOR

BACKGROUND OF INVENTION

The present invention relates in general to threshold detectors and specifically to such detectors having adaptive reference levels. More specifically, this invention relates to adaptive reference threshold detectors that generate logic level outputs whenever the input signal level drops below a predetermined level.

Many circuit applications require the generation of a signal logic level pulse whenever a signal change exceeds a preselected threshold level. Conventionally, the method used to generate this logic level pulse includes the use of a transistor biased "on" at low current level and having its base capacitively coupled to the input signal being monitored. A negative going input signal would shut off transistor current thereby producing a logic level output signal in the transistor's collector circuit.

The basic problem and limitation of this type of circuit arrangement is that switching level and threshold detector sensitivity vary from transistor to transistor as they are highly dependent upon the gain and other characteristics of the individual semiconductor device. It is therefore necessary to accurately control the characteristics of the transistors selected to obtain uniform operation. In addition, when resetting this conventional type threshold detector, its forward base bias current is increased, turning the collector current on again. This causes a relatively slow reset and in addition occasionally produces multiple digital output signals for a single input level change.

SUMMARY OF INVENTION

Accordingly, the present invention provides an adaptive reference threshold detector that provides a single logic level output each time a voltage drop of predetermined magnitude in the level of its input signal from its peak value is observed. In addition, if the voltage should drop still further, after the first logic level output is obtained, additional logic level outputs will occur, one for each time the input signal drops by that predetermined magnitude.

A first operational amplifier is utilized as a voltage follower monitoring the input signal. A capacitor resistor network is diode coupled to the output of this voltage follower such that the capacitor will charge and maintain the highest voltage level that it sees from the voltage follower during the time period of interest. A discharge resistor is coupled to the capacitor via a switch which is used as a threshold reset. The capacitor voltage is fed back to the negative input port of the voltage follower through a field effect transistor (FET). In addition, this capacitor voltage is supplied to the negative input port of a second operational amplifier used as a voltage comparator. The capacitor voltage is coupled through a resistive divider, the values of which are selected for the proper stepdown multiplier. The input signal is fed to the positive input port of this voltage comparator. A logic level output occurs each time the input signal deviates from its maximum value or a reset reference value by a preselected magnitude based upon the value of resistors chosen for the stepdown divider.

It is therefore an object of the present invention to provide a threshold detector that will generate a logic level output.

A further object of the present invention is to provide a threshold detector having an adaptive reference level.

Another object of the present invention is to provide a threshold detector that will generate a logic level output each time the voltage level of an input signal decreases by a predetermined magnitude.

Still another object of the present invention is to provide an adaptive level threshold detector that is easily reset.

BRIEF DESCRIPTION OF THE DRAWINGS

Other objects and many of the attendant advantages of the present invention will be readily apparent as the invention becomes better understood by reference to the following description with the appended claims, when considered in conjunction with the accompanying drawings wherein:

DESCRIPTION OF THE PREFERRED EMBODIMENTS

Figure 1:
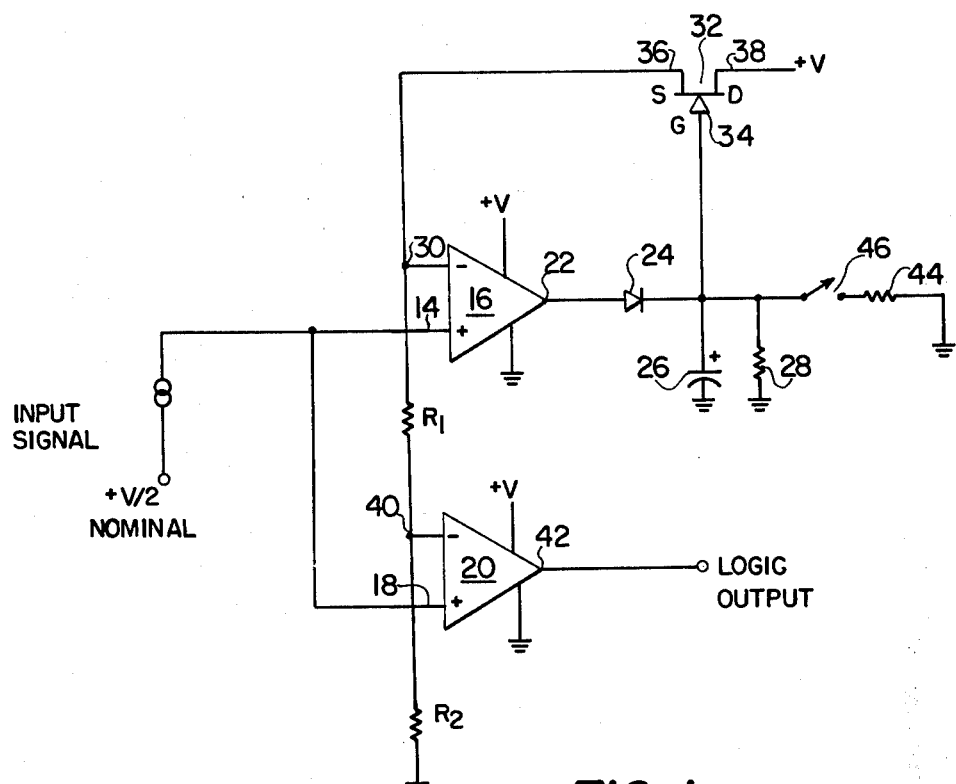
FIG. 1 is a schematic diagram of the adaptive level threshold detector according to the present invention.

Referring now to the drawings wherein like reference characters designate like or corresponding parts throughout the two views, FIG. 1 is a schematic diagram of the adaptive level threshold detector according to the present invention. An input signal of nominal value V/2, the change in value of which is to be threshold detected, is applied simultaneously to the positive input port 14 of a first operational amplifier 16 and the positive input port 18 of a second operational amplifier 20. Operational amplifier 16 operating in conjunction with other components described below functions as a voltage follower circuit using power supply voltage V to supply an adaptive reference level to operational amplifier 20 for the purposes of comparison.

The output 22 of operational amplifier 16 is coupled to the anode of a diode 24, the cathode of which is in turn coupled to the positive terminal of a capacitor 26. The negative terminal of capacitor 26 is coupled to ground. A resistor 28 is coupled in parallel to capacitor 26 from the cathode of diode 24 to ground. This resistor capacitor combination coupled to output 22 of operational amplifier 16 through diode 24 allows the capacitor to charge to the maximum voltage level during the time interval of interest at output 22 consistent with the RC time constant associated with capacitor 26 and resistor 28. The voltage stored on capacitor 26 is fed back to the negative input port 30 of operational amplifier 16 through a field effect transistor (FET) 32. Its gate 34 is coupled directly to the positive terminal of capacitor 26. Power supply voltage V is applied to the FET's drain 38 and its source 36 is coupled directly to negative input port 30 of operational amplifier 16. Therefore, the voltage appearing at port 30 will be a reference level voltage established as a charge upon capacitor 26 offset only by a negligible voltage drop from gate 34 to source 36 of FET 32. For a positive going input signal, the voltage at port 30 equals the voltage at input port 14 ± the OP-AMP error voltage.

This reference voltage at port 30 is used as the reference for threshold comparison.

Operational amplifier 20 having positive input port 18 and a negative input port 40 is used as a comparator. As previously described, the input signal being threshold detected is applied directly to positive input port 18 of comparator 20. The reference at input port 30 of operational amplifier 16 is coupled to negative input port 40 of comparator 20 through a resistive divider. A resistor $R_1$ couples port 30 directly to input port 40 of comparator 20 and second resistor $R_2$ couples port 40 to ground. Therefore, the voltage appearing at port 40 of comparator 20 will be the voltage appearing at port 30 of operational amplifier 16 multiplied by the value $R_2/(R_1+R_2)$.

Once a reference level is established on capacitor 26 and transmitted to input port 40 via the resistive voltage divider, an input signal change, delta, will produce a logic level output 42 only when the input signal change is equal to the peak positive value voltage at port 30 multiplied by the quantity $(1-(R_2/R_1+R_2))$. This peak positive value could be the value when reset has occurred, for a negative going signal.

In order to allow the resetting (adapting) of the reference level, after a logic level output has occurred, a resistor 44 is coupled from ground to the positive terminal of capacitor 26 through a switch 46. By closing switch 46, capacitor 26 is discharged. After switch 46 is reopened, capacitor 26 will charge to a new reference level established by the voltage at output 22 of operational amplifier 16 during the time interval immediately following the opening of the switch. Therefore, the threshold detector can be reset to a new input signal level by momentarily closing switch 46. This operation discharges capacitor 26 to ground level through resistor 44 and as the voltage on port 40 drops below the input signal level, comparator output 42 will be reset to a high logic level. When switch 46 is reopened, capacitor 26 recharges to a voltage level consistent with the new level of the input signal. A further decrease of input signal level beyond the threshold change level newly established in this manner produces another logic output signal.

Figure 2:
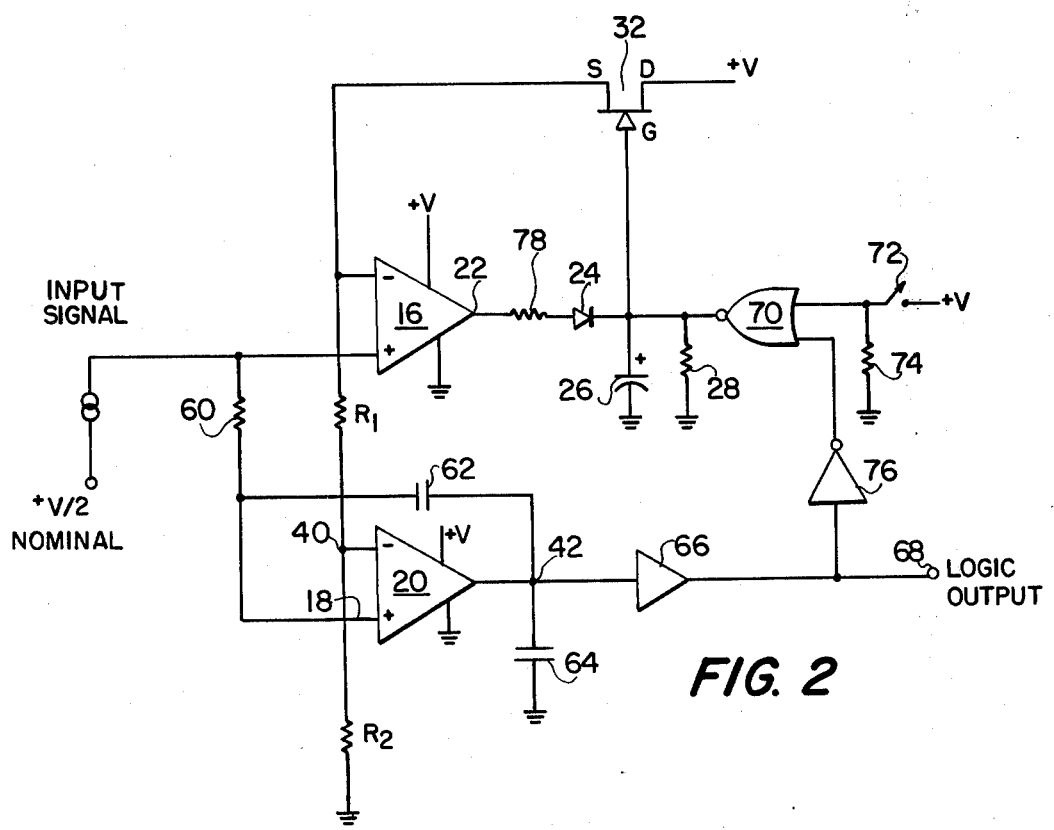
FIG. 2 is a schematic diagram of the threshold detector adapted for use in a specific circuit application.

A slightly modified configuration of the threshold detector according to the present invention is detailed schematically in FIG. 2. This circuit functions identically to that of FIG. 1 but has been adapted to interface with a particular logic system. In this modified circuit, instead of the input signal being applied directly to positive input port 18 of comparator 20, it is applied through a resistor 60. A capacitor 62 feeds the signal at the output 42 of comparator 20 back to its positive input port 18. This resistor capacitor combination forms a positive feedback pulse generating circuit useful in obtaining fast comparator switching action. A capacitor 64 is coupled from output 42 to ground, providing a low impedance to ground at both output and input of comparator 20 to prevent false responses as a result of switching pulses in adjacent circuits. In addition, the output of the threshold detector 68 is now taken as the output of a buffer 66 coupled to output 42 of comparator 20. This buffer aids in furnishing a full logic level output voltage change upon switching.

Resetting in this second configuration is accomplished by coupling the positive terminal of capacitor 26 and its associated resistor 28 to the output port of a gate 70. One of the two input ports to the gate 70 is tied through a switch 72 to the power supply voltage V. In parallel with this input port is a resistor 74 to ground. The second input port to gate 70 is coupled to the output of a buffer 76 tied to the output 68 of the detector. Resetting of the reference level is accomplished by feeding a logic level output back to capacitor 26 through gate 70 and buffer 76. In addition, reset can be accomplished by closing switch 72 thereby inducing a logic output from gate 70. A resistor 78 is included between the output 22 of operational amplifier 16 and diode 24 to prevent excessive loading of the operational amplifier during reset.

Therefore, it is apparent that there has been provided an adaptive level threshold detector having a sensitivity that is precisely controllable and is independent of the characteristics of the active devices used. Reset of this detector is easily accomplished either by the closing of a manual switch or in the case of the configuration of FIG. 2 an automatic logic reset.

Obviously, other embodiments and modifications of the present invention will readily come to those of ordinary skill in the art having the benefit of the teachings presented in the foregoing descriptions and drawings. It is, therefore, to be understood that this invention is not to be limited thereto and that said modifications and embodiments are intended to be included within the scope of the appended claims.

What is claimed and desired to be secured by Letters Patent of the United States is:

1. An adaptive reference threshold detector for sensing a drop of predetermined magnitude in the level of an input signal from its peak value during an interval of time comprising:

a voltage follower circuit including an operational amplifier having a positive input port coupled to said input signal and an output coupled through a diode to a capacitor, whereby said capacitor charges to the maximum voltage level at the output of said voltage follower circuit and thereby establishes a reference voltage derived from said input signal in cooperation with said voltage follower;

an FET device having its gate coupled to said capacitor and its source coupled to the negative input port of said voltage follower circuit operational amplifier in a manner such that negative feedback is applied thereto; and a comparator circuit having a positive input port coupled to said input signal and a negative input port coupled to the source of said FET device through a resistive divider, thereby continuously comparing said input signal with said reference level and producing a logic level output signal whenever the difference in magnitude between said input signal and said reference level exceeds a preselected value.

2. The threshold detector of claim 1, further including:

means for discharging said capacitor so that a new reference level can be established.

* * * * *